United States Patent
Kitagawa et al.

(10) Patent No.: US 9,496,034 B2
(45) Date of Patent: Nov. 15, 2016

(54) MEMORY DEVICE WITH A COMMON SOURCE LINE MASKING CIRCUIT

(71) Applicant: Sony Corporation, Tokyo (JP)

(72) Inventors: Makoto Kitagawa, Folsom, CA (US); Jahanshir Javanifard, Carmichael, CA (US)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 14/186,636

(22) Filed: Feb. 21, 2014

(65) Prior Publication Data

US 2015/0071010 A1 Mar. 12, 2015

Related U.S. Application Data

(60) Provisional application No. 61/874,417, filed on Sep. 6, 2013.

(51) Int. Cl.
  *G11C 13/00* (2006.01)
  *G11C 8/12* (2006.01)

(52) U.S. Cl.
  CPC ....... *G11C 13/0069* (2013.01); *G11C 13/0023* (2013.01); *G11C 13/0026* (2013.01); *G11C 8/12* (2013.01); *G11C 13/0064* (2013.01); *G11C 2213/79* (2013.01)

(58) Field of Classification Search
  None
  See application file for complete search history.

(56) References Cited

U.S. PATENT DOCUMENTS

| | | | |
|---|---|---|---|
| 5,412,609 A * | 5/1995 | Ohtsuka et al. | 365/185.11 |
| 6,356,484 B2 | 3/2002 | Dosaka et al. | |
| 2010/0080066 A1 * | 4/2010 | Watanabe | 365/185.23 |
| 2011/0194361 A1 * | 8/2011 | Kawahara et al. | 365/189.09 |

FOREIGN PATENT DOCUMENTS

| | | |
|---|---|---|
| EP | 1194930 B1 | 8/2004 |
| EP | 2169684 A1 | 3/2010 |
| WO | WO-2009086618 A1 | 7/2009 |

OTHER PUBLICATIONS

Smart Charge Prior Art Search Report, 15 Pages, Oct. 10, 2013.

* cited by examiner

*Primary Examiner* — Kretelia Graham
(74) *Attorney, Agent, or Firm* — Sheridan Ross P.C.

(57) ABSTRACT

A memory device comprising a plurality of memory tiles, each tile comprising a local common source line (CSL) plate, a plurality of bitlines and a plurality of wordlines, each coupled to a plurality of memory cells and a masking circuit, coupled to each of the memory tiles, for controlling whether to raise the local CSL plate and the plurality of bitlines based on the a global common source line.

11 Claims, 5 Drawing Sheets

MEMORY DEVICE WITH A COMMON SOURCE LINE MASKING CIRCUIT

CROSS-REFERENCE TO RELATED APPLCIATION

This application claims benefit of U.S. Provisional Patent Application No. 61/874,417 filed Sep. 6, 2013, which is hereby incorporated in its entirety.

FIELD

Certain embodiments of the disclosure relate to memory devices. More specifically, embodiments of the present disclosure relate to a memory device with a common source line masking circuit.

BACKGROUND

The growing demand for high performance data storage and access in various consumer electronic and computing devices has driven the development of nonvolatile memory (NVM) technologies. Resistive random access memory (ReRAM) is one of alternative NVMs used because of its low operating voltage, high speed and scalability. NVM is employed in computers, mobile computing devices, memory cards, and the like. For more information regarding NVM such as ReRAM, please see commonly assigned U.S. Pat. No. 6,867,996, hereby incorporated by reference in its entirety.

A RAM module is composed of a plurality of memory tiles. Each of the memory tiles further comprises an array of memory cells. The memory cells each represent a "bit" in memory. Each memory cell comprises, minimally, a transistor coupled to a resistive material (1T1R), further coupled to a common source line voltage (CSL). The transistor is further coupled to a bit-line and a word-line.

The size of the memory tile in a RAM module and the number of cells in each memory tile are limited by the impedance of the bitline, CSL and the word line. A bit is modified in the memory cell based on the direction bias across the memory cell. For example, the "set" operation (set pulse) sets a high resistance to a low resistance in the resistive material of the memory cell. A "reset" operation (reset pulse) reverses the polarity of the direction bias, setting a low resistance to a high resistance in the resistive material of the memory cell. Conventionally, the set pulse is applied across the memory cells across several tiles at the same time to obtain high throughput.

However, if some cells are already be in LRS state, applying a set pulse will result in excessive power being consumed to for an operation which is only required for a portion of the memory tiles.

Therefore, there is a need in the art for a memory device with a common source line.

SUMMARY

A memory device with a common source line masking is provided as set forth more completely in the claims.

These and other features and advantages of the present disclosure may be appreciated from a review of the following detailed description of the present disclosure, along with the accompanying figures in which like reference numerals refer to like parts throughout.

DETAILED DESCRIPTION

Certain implementations of the invention may be found in a memory device with a common source line masking circuit. According to one embodiment, a common source line masking circuit is coupled between a data latch for each bitline in a memory tile and the bitline and common source line drivers. The masking circuit masks the global common source line voltage when raising the common source line to a set voltage, masking the signal for each tile, depending on whether the memory tile requires a set pulse. Accordingly, those tiles that require a set pulse have a local common source line and a plurality of bitlines raised to the set voltage while those tiles that do not require a set pulse maintain the local common source line and the bitline at a Vss voltage (Vss signal).

Figure 1:
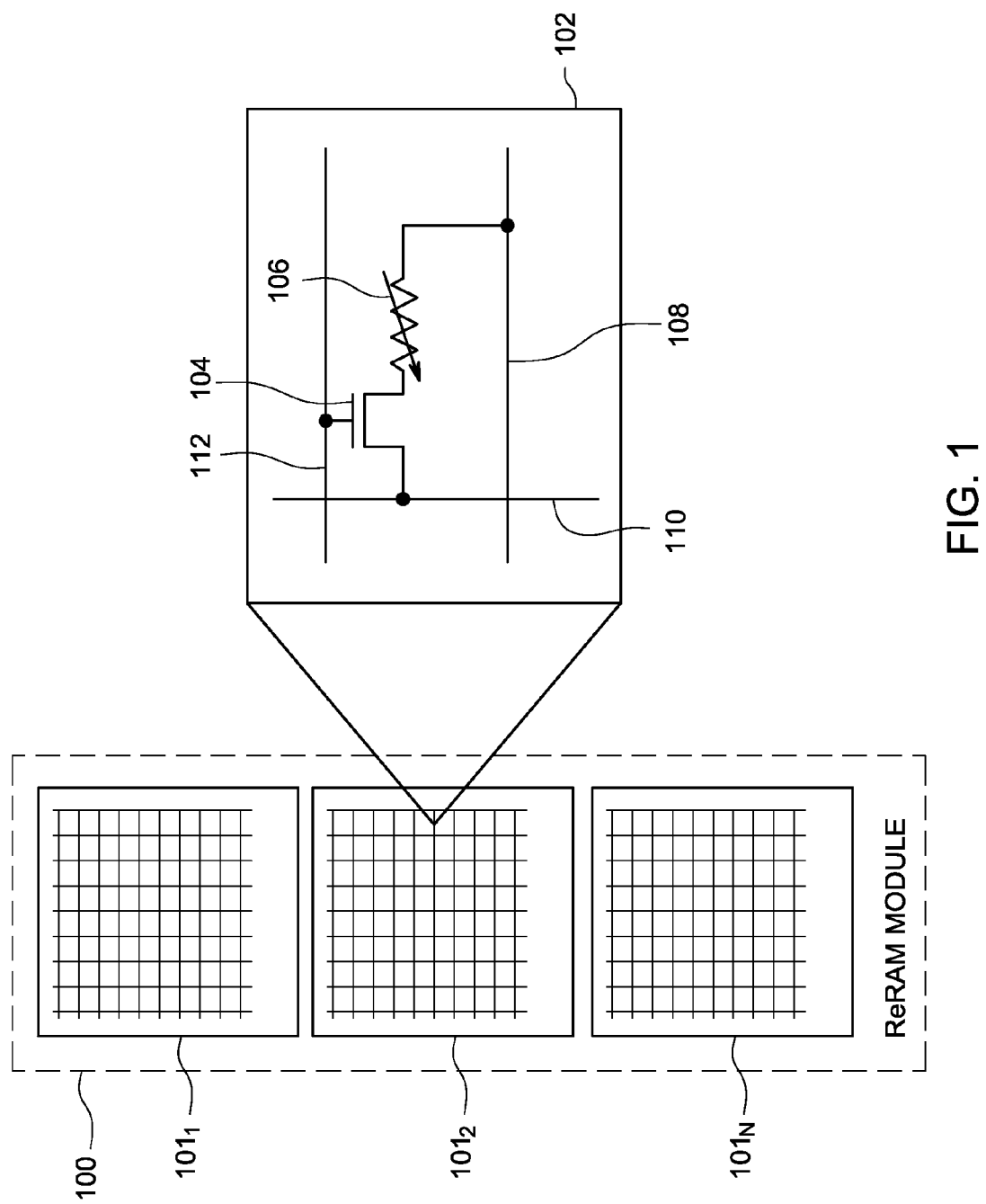
FIG. 1 is a depiction of a memory tile in a memory module according to the reference art.

To understand the structure of the module of the present invention, a RAM module of the background art will be described for purposes of comparison. FIG. 1 is a depiction of a memory device 100 according to the background art. The memory device 100 comprises a plurality of memory tiles $101_1$ to $101_n$ (where n is an integer). The memory tile $101_2$, for example, comprises an array of m memory cells (where m is an integer), one of which is memory cell 102. The memory cell 102 is an exemplary depiction of one of the memory cells of the array of memory cells on the memory tile 101. The memory cell 102 comprises a switch 104 coupled to a variable resistance material (R) 106.

The gate of the switch 104 is coupled to the word line (WL) 112. The source of the switch 104 is coupled to the bit line (BL) 110. R 106 is further coupled to the common source line (CSL plate) 108. The CSL 108 is common to all memory cells within the memory tile 101, i.e., all variable resistance materials in each cell are coupled to the CSL 108. According to some embodiments, R 106 comprises Dual-layered conductive bridge elements that employ Copper Tellurium (CuTe) based conductive material and Gadolinium Oxide (GdOx) thin insulators.

R 106 can occupy a high resistance state (HRS) or a low resistance state (LRS), corresponding to whether the memory cell 102 is considered "on" or "off". R 106 comprises top and bottom electrodes and allows bipolar switching where a HRS turns into a LRS when the top electrode is positively biased and turning a LRS state to a HRS state when the bottom electrode is positively biased. The top electrode forms a plate covering half of the memory cell 102, for example. Bringing the resistance of R 106 from HRS to LRS is defined as a "SET" operation. Bringing the resistance of R 106 from LRS to an HRS is defined as "RESET" operation on the memory cell 102.

In an idle state (no SET or RESET operation) of the memory cell 102, CSL 108, BL 110 and WL 112 are grounded to reduce the current (i.e., are at a LOW voltage state, approximately 0V). Once a RESET operation is invoked, BL 110 and WL 112, which have low parasitic capacitance, are set to a HIGH voltage (for example, 5V) while CSL 108 remains at a stable voltage, i.e. 0V. Varying BL 110 and WL 112 requires a small amount of energy because BL and WL are only common to cells along the direction of the BL and WL, i.e., they have a low capacitance. For a RESET operation, only a small amount of energy is expended because only BL 110 and WL 112 are modified.

However, moving from an idle state to a SET operation (using a SET pulse), initially CSL plate 108 is set to a HIGH voltage state, BL 110 must be set to a HIGH voltage state, while WL is in a LOW voltage state. Next, during the SET operation, WL is also set to a HIGH voltage state, due to a voltage offset between CSL 108 and the BL 110.

Subsequently, during the SET operation, BL 110 is set to a LOW voltage state, while CSL 108 and WL 112 remain HIGH. After the completion of the SET pulse, the CSL 108, BL 110 and WL 112 are all set to idle state conditions, i.e., CSL 108, BL 110 and WL 112 are grounded. However, in the background art depicted in FIG. 1, because of the large parasitic capacitance accumulated in CSL 108, changing the voltage of CSL 108, e.g., raising the CSL to the set voltage (VSET) requires a large amount of power usage due to the large capacitance built up on the CSL 108. Since the memory module is generally used in low power mobile device, these devices are negatively impacted by large power consumption.

Those of ordinary skill in the art will recognize that the memory device 100 may be ReRam, CBRAM, or any RAM with common source line plate architecture, including 1T, 1R, 1T1R RAM or the like.

Figure 2:
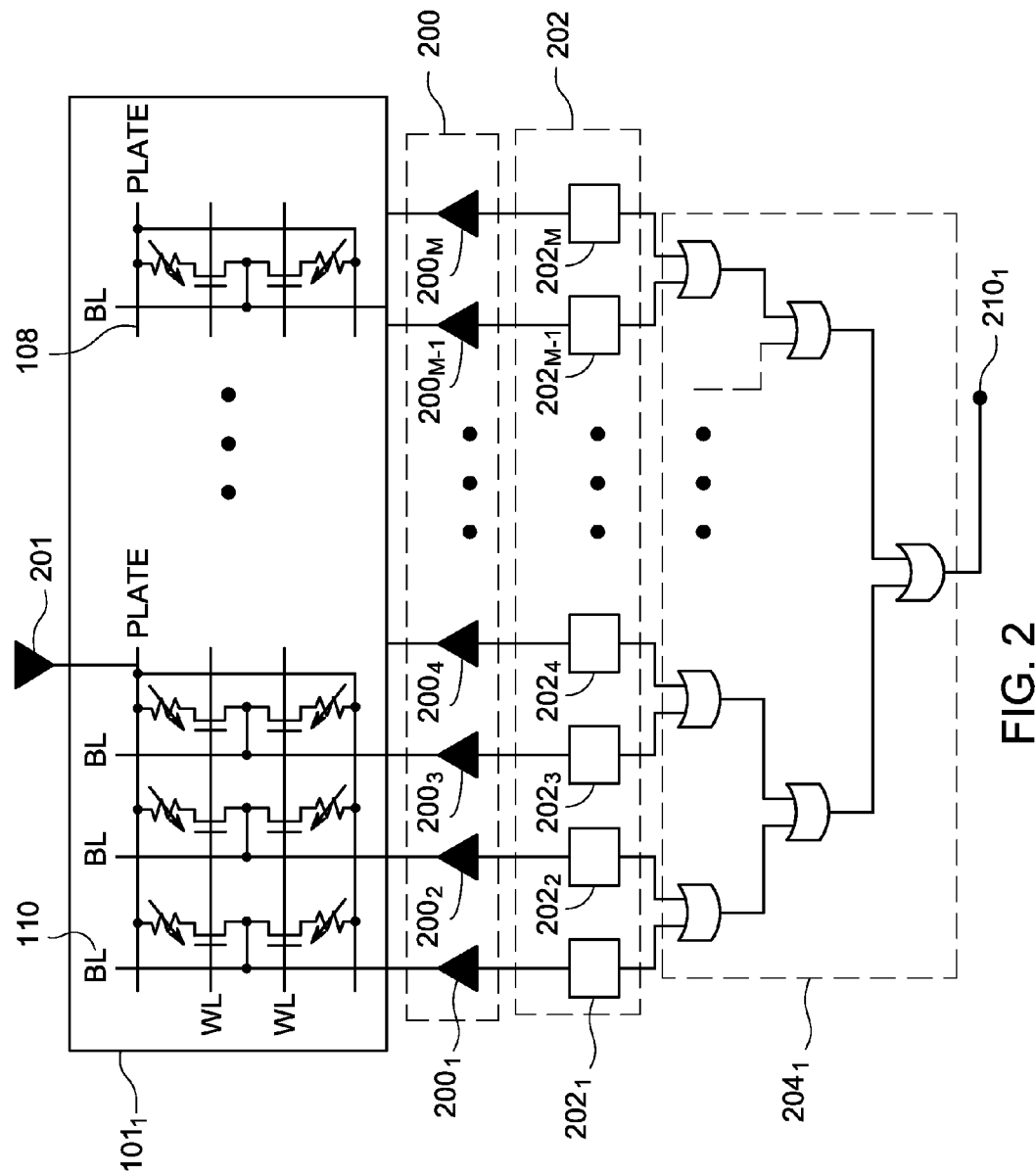
FIG. 2 is a circuit diagram depicting a memory tile and associated circuitry in accordance with exemplary embodiments of the present invention.

FIG. 2 is a circuit diagram depicting tile $101_1$ and associated failure circuitry in accordance with exemplary embodiments of the present invention. As described in more detail in FIG. 1, tile $101_1$ comprises a plurality of bitlines, a plurality of wordlines and a CSL 108 (commonly referred to as a CSL plate). Each bitline $110_1 \ldots _M$ is driven by a bitline driver $200_1 \ldots _M$, where M is an integer and is variable, prior to fabrication of the device 100, based on configuration requirements. The bitline drivers $200_1 \ldots _M$ are each coupled to corresponding data latches $202_1 \ldots _M$.

Conventionally, in order to obtain high throughput for the memory device 100, a set pulse is applied across several tiles from the tiles $101_1$ to $101_N$ simultaneously. A verify-read sequence is performed on each cell prior to the set pulse to verify that the resistance of a cell is lower than a certain resistance threshold to determine whether the cell is in LRS or HRS. If the verify-read pulse determines that the cell resistance is lower than the resistance threshold, the corresponding data latch, e.g., data latch $202_1$, sets a failure bit to "0". Otherwise, if the verify-read pulse determines that the LRS cell resistance is not lower than the resistance threshold, the failure but is set to "1", indicating that the memory cell selected by the bitline driver $200_1$ is already set to "1".

Each data latch 202 has a failure bit set according to the memory cells along each corresponding bitline 110. The data latches 202 are coupled to a collection of OR gates 204, i.e., a failure circuit. The goal of the collection of OR gates $204_1$ is to indicate whether this particular tile $101_1$ has any memory cells that require a set pulse. If any of the data latches 2021 to 202M contains a failure bit set to 1, the output $210_1$ ("set_fail_bigor") will also be "1", or high (H). Consequently, the output $210_1$ is fed to the bitline drivers 200 and the CSL driver 201 for the tile $101_1$. If the output $210_1$ is high, at least one memory cell requires a set pulse to be applied, and therefore the set pulse will be applied to the entire tile 1011. If the output $210_1$ is low, none of the memory cells require a set pulse to be applied, and the CSL 108 will be maintained at Vss, or ground, voltage. Each tile $101_1$ to $101_N$ is associated with an identical set of bitline drivers 200, data latches 202, collection of OR gates 204 and the output signal of the collection of gates 204, the output indicating whether a set pulse should be applied to the tile or not. Accordingly, only those tiles with set_fail_bigor (e.g., signal $210_1$) set to high will raise the CSL and bitline to VSET.

Figure 3:
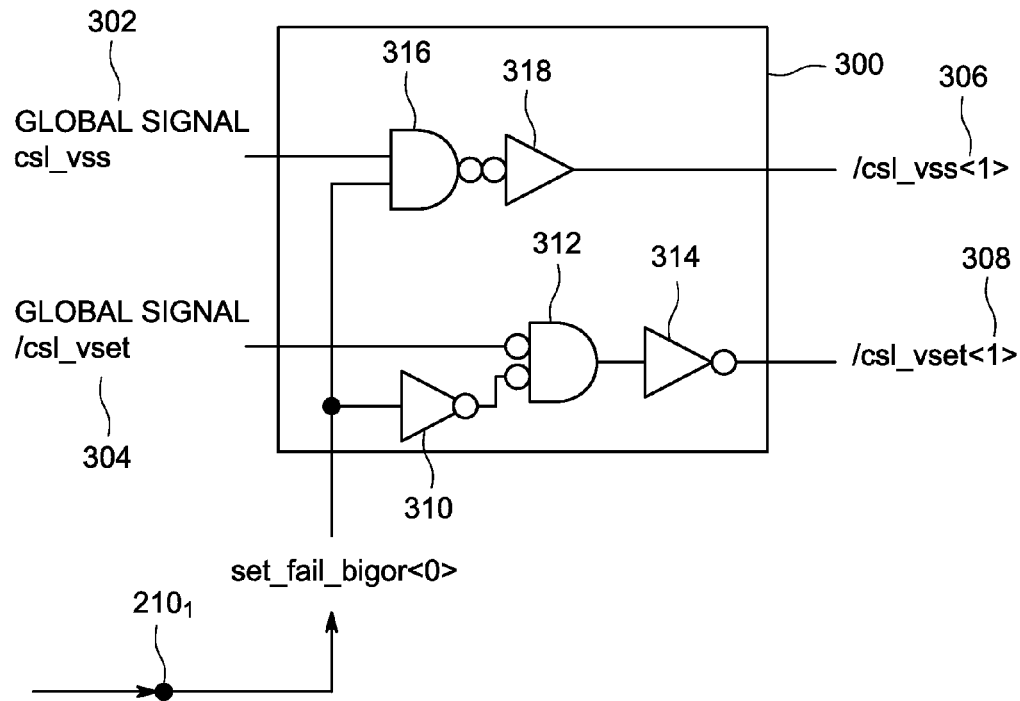
FIG. 3 is a circuit diagram depicting a masking circuit in accordance with exemplary embodiments of the present invention.

FIG. 3 is a circuit diagram depicting a masking circuit 300 for masking the global CSL signal in accordance with exemplary embodiments of the present invention. The circuit comprises an input set_fail_bigor $210_1$ (input 210), input csl_vss 302 (input 302), and input/csl_vset 304 (input 304). Signals 302 and 304 are global signals indicating whether all of the CSL plates across all tiles 1011 to 101N should be set to Vss (csl_vss =H), or should be set to VSET (csl_vset =H).

The circuit comprises output signals csl_vss<1> 306 (output 308) and csl_vset<1> 308 (output 308) to tile $101_1$. If output 306 is high, the CSL driver 201 for tile $101_1$ will bring the CSL to Vss voltage. If output 308 is high, the CSL driver 201 for tile $101_1$ will bring the CSL to VSET voltage.

Though the masking circuit 300 is shown as being coupled to tile $101_1$, each tile has an identical circuit between each of the plurality of data latches and the CSL driver/bitline drivers belonging to each tile. Accordingly, each individual tile can mask the global CSL signal and avoid bringing the CSL plate to VSET, thereby reducing power consumption in the memory device 100.

The masking circuit 300 further comprises a logical portion for determining the signals at outputs 306 and 308. The logical portion comprising a first inverter 310, an inverted input AND gate 312, a second inverter 314, a second AND gate with inverted output 316, and an inverted input inverter 318.

Output 306 is controlled by input $210_1$ and the global signal input 304. In an exemplary scenario, if it is determined by the OR gates $204_1$ that $210_1$ is HIGH (i.e., that a set pulse must be applied across tile $101_1$) and globally, the CSL has been raised to VSET, output 308 will output HIGH signal. Conversely, if the CSL has been raised to VSET, but the signal $210_1$ is LOW (indicating that a set pulse does not need to be applied to the tile $101_1$), output 308 will output an LOW signal. As will be shown in FIGS. 4 and 5, if output 306 is HIGH and output 308 is L, the CSL driver 201 will keep the CSL plate 108 and the bitline 110 at Vss. If the output 308 is HIGH and the output 306 is LOW, the CSL driver 201 will raise the CSL plate 108 and the bitline 110 to VSET.

Those of ordinary skill in the art will recognize that the logical portion of the circuit shown comprising the logical gates may be modified internally while functioning as described above. Therefore, the logical configuration shown in FIG. 3 is merely exemplary and the present invention is not limited thereto.

Figure 4:
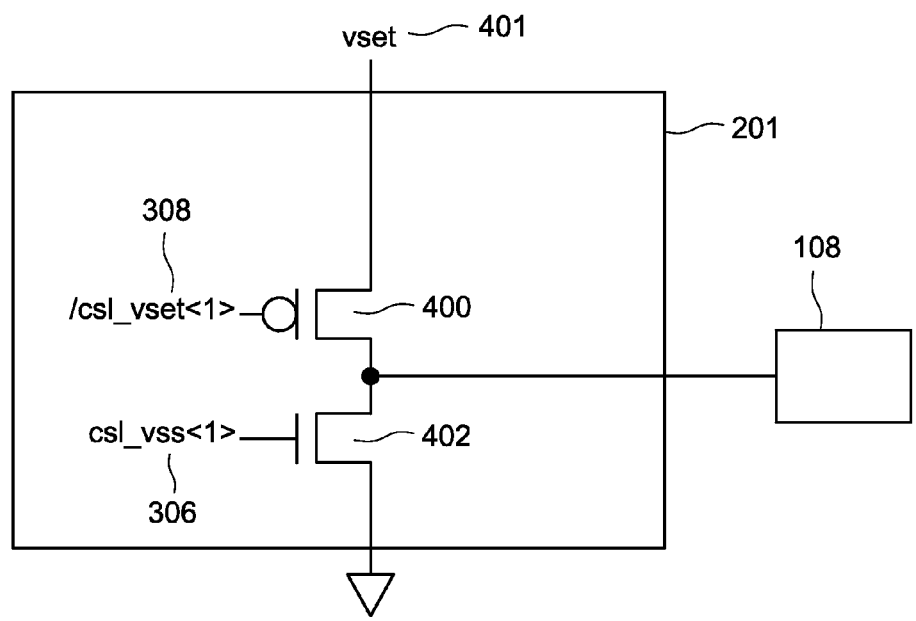
FIG. 4 is a circuit diagram depicting a common source line driver in accordance with exemplary embodiments of the present invention.

FIG. 4 is a circuit diagram depicting a common source line driver 201 in accordance with exemplary embodiments of the present invention. The CSL driver 201 depicted is coupled to the CSL plate 108 of memory tile $101_1$. Each memory tile $101_1$ to $101_N$ has a CSL driver identical to CSL driver 201, except that inputs 308 and 306 will be from the respective masking circuit associated with the corresponding tile $101_1$ to $101_N$. Each CSL driver determines whether the CSL driver associated with the corresponding tile is driven to VSET or VSS, depending on various inputs.

The CSL driver 201 comprises a first transistor 400 and a second transistor 402. The source of the transistor 400 is coupled to a VSET voltage source 401. The source of the transistor 402 is coupled to ground (or Vss). The input 308 (/csl_vset<1>) is coupled to the gate of the transistor 400. The input 306 (/csl_vss<1>) is coupled to the gate of the transistor 402. The output of the CSL driver 201 is coupled to the CSL plate 108 for memory tile $101_1$.

According to an exemplary embodiment, if the masking circuit 300 has an output 308 which is HIGH and an output 306 which is L, the transistor 400 is switched on while transistor 402 is switched off, bringing the CSL 108 up to VSET voltage. Conversely, if the masking circuit 300 has an output 308 which is LOW and an output 306 which is H, the transistor 402 is switched on while transistor 400 is switched off, bringing the CSL 108 to VSS. According to exemplary embodiments, transistor 400 is a p-type transistor.

Those of ordinary skill in the art will recognize that the logical portion of the circuit shown comprising the logical gates may be modified internally while functioning as described above. Therefore, the logical configuration shown in FIG. 4 is merely exemplary and the present invention is not limited thereto.

Figure 5:
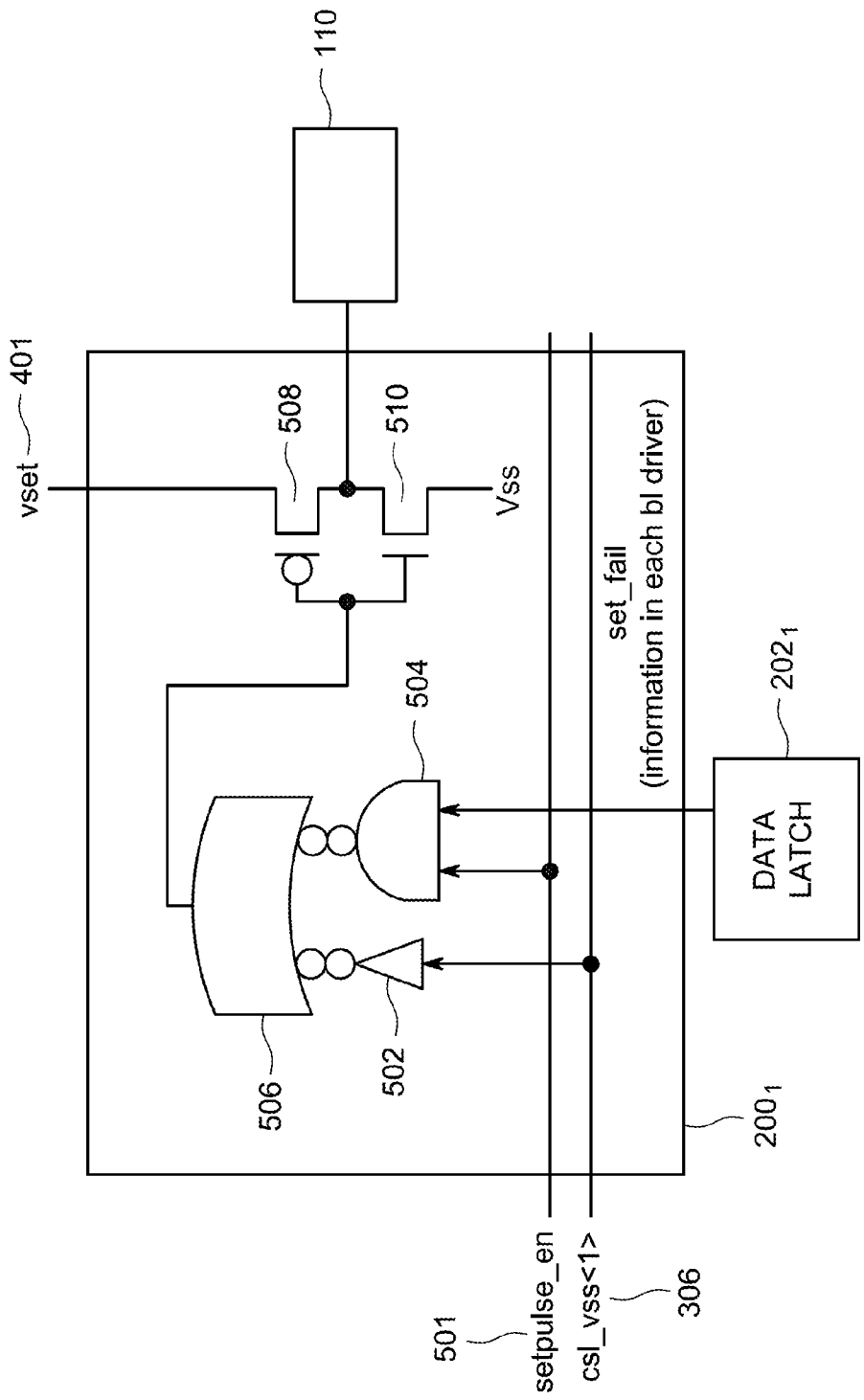
FIG. 5 is a circuit diagram depicting a bitline driver in accordance with exemplary embodiments of the present invention.

FIG. 5 is a circuit diagram depicting a bitline driver $200_1$ in accordance with exemplary embodiments of the present invention. Each memory tile $101_1$ to $101_N$ has a plurality of bitline drivers identical to bitline driver $200_1$, except that input 306 will be from the respective masking circuit and the data latch will be from the respective bitline associated with the corresponding tile $101_1$ to $101_N$. The bitline driver $200_1$ controls whether a bitline of a tile is driven to VSET or VSS. Each tile has one bitline for each column of memory cells contained therein.

The bitline driver $200_1$ comprises an input of setpulse_en 501, set_fail from data latch $202_1$ and csl_vss<1> 306. Signal 306 is coupled from the masking circuit 300 shown in FIG. 3. The setpulse_en 501 is shared among the data latches 202 and goes HIGH when the set_fail from the data latch $202_1$ in each BL is high. The set_fail from data latch $202_1$, as described above, is an indicator of whether the associated bitline is coupled to a memory cell that should be brought to LRS via a set operation. The signal csl_vss<1> 306, as described above in reference to FIGS. 3 and 4, indicates whether the CSL for tile $101_1$ should be brought to the VSS voltage. The gate of the transistors 508 and 510 are driven according to the data latch output.

The bitline driver $200_1$ comprises a logical portion for determining whether the bitline 110 is drive to VSET or VSS. The logical portion of the circuit comprises an inverter 502, an AND gate with an inverted output 504 and an inverted input OR gate 506. The output of the OR gate 506 is coupled to the gate of transistor 508 and 510. If the set_fail bit is HIGH and setpulse_en 501 is H, the output of the OR gate 506 goes HIGH. Therefore the voltage signal at the gate of transistor 508 is LOW, while the voltage signal at the gate of transistor 510 is HIGH. Accordingly, transistor 510 is switched on, coupling the bitline 110 to the VSS voltage. However, if signal 501 or signal set_fail is LOW, and the csl_vss<1> 366 is low, the output at OR gate 506 is LOW. Accordingly, the voltage signal at the gate of transistor 508 is H, while the voltage at the gate of transistor 510 is LOW, switching transistor 508 on, and raising the bitline 10 to VSET voltage. According to exemplary embodiments, transistor 508 is a p-type transistor.

Those of ordinary skill in the art will recognize that the logical portion of the circuit show comprising the logical gates may be modified internally while functioning as described above. Therefore, the logical configuration shown in FIG. 5 is merely exemplary and the present invention is not limited thereto.

Figure 6:
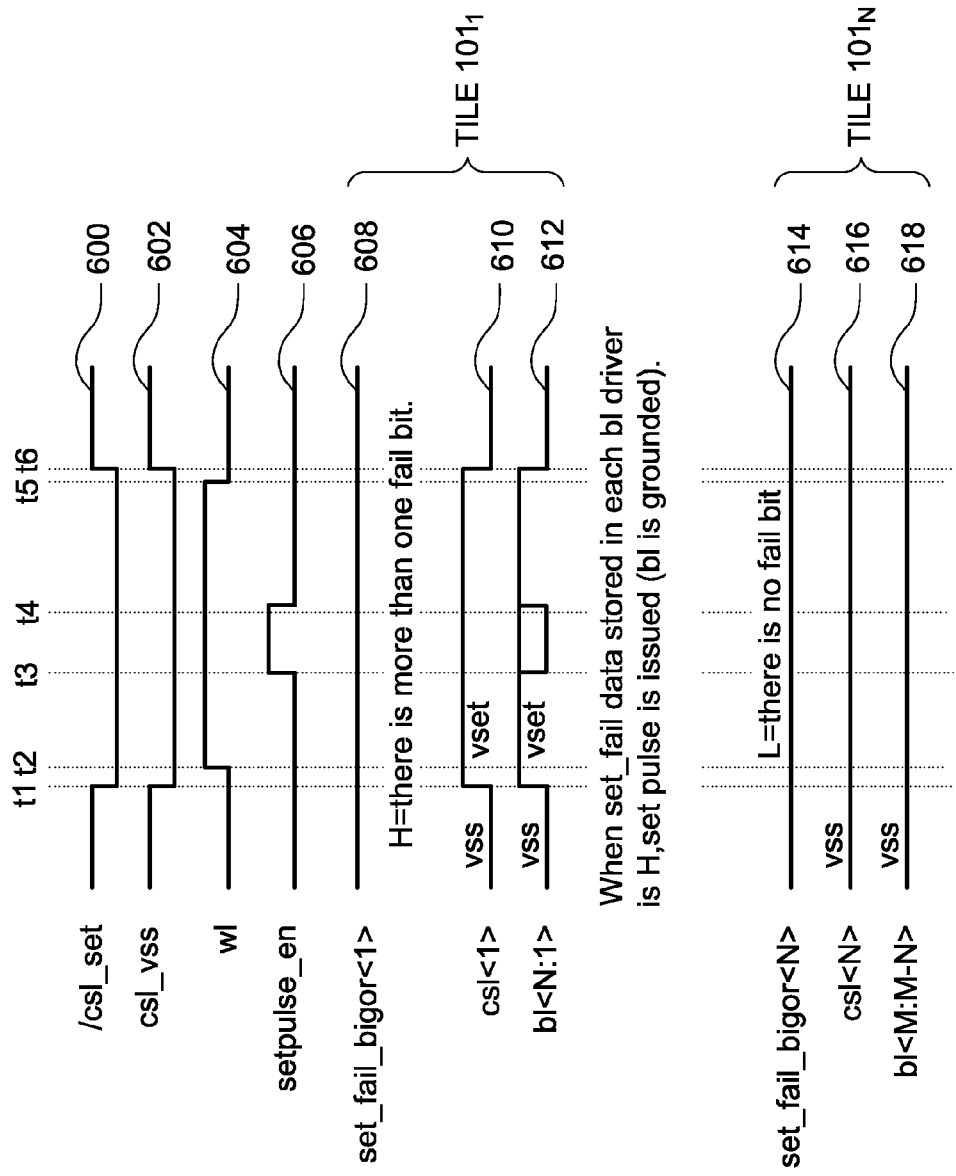
FIG. 6 is a circuit diagram depicting the pulses for a set operation in accordance with exemplary embodiments of the present invention.

FIG. 6 is a circuit diagram depicting the voltage levels for various signals during a set operation for two memory tiles $101_1$ and $101_N$ in accordance with exemplary embodiments of the present invention.

The csl set pulse 600 is depicted as initially beginning HIGH, then transitioning to LOW at time t1 for a period of time before going back to HIGH at time t6. The csl_vss signal 602 also begins at HIGH, then goes low at time t1 and remains low until time t6.

The wordline signal 604, begins at LOW and goes to HIGH at time t2, and then goes to LOW again at time t5. The setpulse_en signal 606 goes to HIGH at time t3 and goes back to LOW at time t4.

For tile $101_1$, the set_fail_bigor<1> is HIGH, indicating that a set_fail bit is stored in one of the data latches 202. Accordingly, the set pulse should be applied to the tile $101_1$ by raising the csl<1> 610 signal and the bitline signal 612 from Vss to VSET.

In contrast, in another tile, e.g., tile $101_N$ does not have any data latches with a set_fail bit that is HIGH, therefore the set_fail_bigor signal 614 is LOW. Therefore, the CSL plate and all bitlines for tile $101_N$ remain at Vss voltage. Accordingly, if some portion of the memory tiles in device 100 have their CSL raised to VSET, while some portion of the tiles in device 100 have their CSL and bitline remain at Vss, less power is consumed by device 100 as compared to if all CSL plates and bitlines in memory device 100 were required to be raised to VSET regardless of the status of the status of each memory cell.

While the present disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:
1. A memory device comprising:
a plurality of memory tiles, each tile comprising a local common source line (CSL) plate, a plurality of bitlines and a plurality of wordlines, each of the plurality of bitlines and the plurality of wordlines coupled to a plurality of memory cells; and
a masking circuit, coupled to each of the memory tiles, for controlling whether to raise the local CSL plate to a set operation voltage and the plurality of bitlines based on a global common source line, wherein the masking circuit comprises a Vss input, a VSET input, and a failure input generated by a failure circuit.
2. A memory device comprising:
a plurality of memory tiles, each tile comprising a local common source line (CSL) plate, a plurality of bitlines and a plurality of wordlines, each of the plurality of bitlines and the plurality of wordlines coupled to a plurality of memory cells;

a masking circuit, coupled to each of the memory tiles, for controlling whether to raise the local CSL plate to a set operation voltage and the plurality of bitlines based on a global common source line, wherein the masking circuit comprises:

a Vss input receiving a signal representing whether the global common source line is coupled to a Vss voltage;

a VSET input receiving a signal representing whether the global common source line is coupled to a set operation voltage (VSET voltage); and a failure input, generated by a failure circuit, the failure circuit receiving a signal corresponding to a plurality of data latches for outputting a failure bit, each data latch coupled to a corresponding bitline of the plurality of bitlines, wherein the Vss input, the VSET input and the failure input are coupled to a logical portion of the masking circuit which has a control output coupled to a CSL driver for each memory tile, controlling whether to raise the CSL to VSET or keep the CSL at Vss.

3. The memory device of claim 2, the masking circuit further comprising:

a Vss portion comprising:
  a first AND gate with a first inverted output, wherein inputs to the first AND gate comprise the Vss input and the failure input; and
  a first inverter with an inverted input coupled to an output of the first AND gate, the first inverter having a Vss output that drives the local CSL plate and the plurality of bitlines to Vss; and a VSET portion comprising:
  a second inverter with the failure input as an input;
  a second AND gate with a first inverted input and second inverted input, wherein an output of the second inverter is coupled to the first inverted input and the VSET input is coupled to the second inverted input; and
  a third inverter with an input coupled to an output of the second AND gate, the third inverter having a VSET output that drives the local CSL plate and the plurality of bitlines to VSET.

4. The memory device of claim 3, further comprising:
a plurality of bitline drivers corresponding to the plurality of bitlines in each memory tile; and
a CSL driver coupled to the CSL plate for each memory tile.

5. The memory device of claim 4, each CSL driver comprising:
a first transistor having a gate coupled to the VSET output and a source coupled to the VSET voltage; and
a second transistor having a gate coupled to the Vss output and a sourced coupled to the Vss voltage,
wherein the first transistor and the second transistor are coupled at a drain of each transistor.

6. The memory device of claim 5, wherein an output of the CSL driver is coupled to the local CSL plate from the drain of each transistor.

7. The memory device of claim 5, wherein the first transistor is a P-type transistor.

8. The memory device of claim 4, each of the plurality of bitline drivers comprising:
a fourth inverter with an input coupled to the Vss output;
a third AND gate with an inverted output, with a set pulse enabling signal and the failure bit as inputs to the third AND gate;
an OR gate with inverted inputs coupled to an output of the fourth inverter and an output of the third AND gate;
a first transistor with a gate coupled to an output of the OR gate and a source coupled to the VSET voltage; and
a second transistor with a gate coupled to the output of the OR gate and a source coupled to the Vss voltage, wherein the first and second transistors are coupled at the drains.

9. The memory device of claim 8, wherein the first transistor is a P-type transistor.

10. The memory device of claim 5, wherein the CSL driver is coupled to the local CSL plate via an output from the drain of the first transistor of the CSL driver and the second transistor of the CSL driver.

11. The memory device of claim 4, the failure circuit comprising:
a plurality of OR gates reading a plurality of failure bits, each failure bit output from each of the latches, wherein each respective OR gate of the plurality of OR gates generates a HIGH output when one of the failure bits coupled to the respective OR gate is HIGH and otherwise the respective OR gate generates a LOW output.

* * * * *